(12) United States Patent
Fidric et al.

(10) Patent No.: US 11,422,479 B2
(45) Date of Patent: Aug. 23, 2022

(54) METHOD FOR MANUFACTURING LIGHT GUIDE ELEMENTS

(71) Applicant: Waymo LLC, Mountain View, CA (US)

(72) Inventors: Bernard Fidric, Cupertino, CA (US); Pierre-Yves Droz, Mountain View, CA (US); David Hutchison, Santa Clara, CA (US)

(73) Assignee: Waymo LLC, Mountain View, CA (US)

(*) Notice: Subject to any disclaimer, the term of this patent is extended or adjusted under 35 U.S.C. 154(b) by 0 days.

(21) Appl. No.: 17/188,562

(22) Filed: Mar. 1, 2021

(65) Prior Publication Data

US 2021/0208506 A1 Jul. 8, 2021

Related U.S. Application Data

(63) Continuation of application No. 16/684,955, filed on Nov. 15, 2019, now Pat. No. 10,962,883, which is a continuation of application No. 15/794,966, filed on Oct. 26, 2017, now Pat. No. 10,503,071.

(51) Int. Cl.
*G03F 9/00* (2006.01)
*G03F 7/26* (2006.01)

(52) U.S. Cl.
CPC .............. *G03F 9/7003* (2013.01); *G03F 7/26* (2013.01)

(58) Field of Classification Search
CPC ................................ G03F 7/26; G03F 9/7003
USPC ....................................................... 430/22, 30
See application file for complete search history.

(56) References Cited

U.S. PATENT DOCUMENTS

| | | | |
|---|---|---|---|
| 5,902,715 A | 5/1999 | Tsukamoto et al. | |
| 6,611,635 B1 | 8/2003 | Yoshimura et al. | |
| 9,008,480 B2 | 4/2015 | Nakashiba et al. | |
| 9,703,095 B2 | 7/2017 | Pakhchyan | |
| 9,746,608 B1 | 8/2017 | Rabiei | |
| 10,503,071 B2 | 12/2019 | Fidric et al. | |
| 2004/0037487 A1 | 2/2004 | Nayaka et al. | |
| 2006/0198598 A1 | 9/2006 | Fang et al. | |
| 2012/0155822 A1 | 6/2012 | Yanagisawa et al. | |
| 2013/0143007 A1 | 6/2013 | Kim et al. | |
| 2014/0063853 A1 | 3/2014 | Nichol et al. | |
| 2017/0045669 A1 | 2/2017 | Nichol et al. | |

FOREIGN PATENT DOCUMENTS

| | | |
|---|---|---|
| CN | 102369461 | 3/2012 |
| JP | H05264833 | 10/1993 |
| JP | 2000221347 | 8/2000 |
| JP | 2004062157 | 2/2004 |
| JP | 2004133300 | 4/2004 |
| JP | 2010237301 | 10/2010 |
| JP | 2010256877 | 11/2010 |
| JP | 2012198566 | 10/2012 |

OTHER PUBLICATIONS

International Searching Authority, International Search Report and Written Opinion dated Jan. 16, 2019, issued in connection with International Patent Application No. PCT/US2018/054357, file don Oct. 4, 2018, 10 pages.

Japanese Patent Office, Notice of Reasons for Rejection dated Apr. 30, 2021, issued in connection with Japanese Patent Application No. 2020-518815, 9 pages (English Translation).

*Primary Examiner* — Christopher G Young
(74) *Attorney, Agent, or Firm* — McDonnell Boehnen Hulbert & Berghoff LLP

(57) ABSTRACT

Systems and methods described herein relate to the manufacture of optical elements and optical systems. An example method includes overlaying a first mask on a photoresist material and a substrate, and causing a light source to illuminate the photoresist material through the first mask during a first exposure so as to define a first feature. During the first exposure, the light source is positioned at a non-normal angle with respect to a plane parallel to the substrate. The method includes developing the photoresist material so as to retain an elongate portion of the photoresist material on the substrate. A first end of the elongate portion includes an angled portion that is sloped at an angle with respect to a long axis of the elongate portion. The method also includes depositing a reflective material through a second mask onto the angled portion.

20 Claims, 14 Drawing Sheets

Side View

METHOD FOR MANUFACTURING LIGHT GUIDE ELEMENTS

CROSS-REFERENCE TO RELATED APPLICATIONS

This application claims priority to U.S. patent application Ser. No. 16/684,955 filed Nov. 15, 2019 which is a continuation of U.S. patent application Ser. No. 15/794,966 filed Oct. 26, 2017, the contents of both of which are incorporated herein by reference in their entirety.

BACKGROUND

Unless otherwise indicated herein, the materials described in this section are not prior art to the claims in this application and are not admitted to be prior art by inclusion in this section.

Light guiding devices may include optical fibers, waveguides, and other optical elements (e.g., lenses, mirrors, prisms, etc.). Such light guiding devices may transmit light from an input facet to an output facet via total or partial internal reflection. Furthermore light guiding devices may include active and passive optical components, such as optical switches, combiners, and splitters.

Optical systems may utilize light guiding devices for a variety of purposes. For example, optical fibers may be implemented to transmit optical signals from a light source to a desired location. In the case of light detection and ranging (LIDAR) devices, a plurality of light sources may emit light, which may be optically coupled to the light guiding devices so as to be directed into a given environment. The light emitted into the environment may be detected by a receiver of the LIDAR devices so as to provide estimated distances to objects in the environment.

SUMMARY

Systems and methods described herein are applicable to the manufacture of optical systems. For example, the present disclosure describes certain optical elements (e.g., light guide devices) and methods for their manufacture.

In a first aspect, a method is provided. The method includes depositing a photoresist material on a substrate and overlaying a first mask on the photoresist material, wherein the first mask defines a first feature. The method additionally includes causing a light source to illuminate the photoresist material through the first mask. The light source is positioned at a first angle. The first angle includes a non-normal angle with respect to a plane parallel to the substrate. The method also includes developing the photoresist material so as to retain an elongate portion of the photoresist material on the substrate. A first end of the elongate portion includes an angled portion. The angled portion is sloped at an angle with respect to a long axis of the elongate portion. The method yet further includes overlaying a second mask on the developed photoresist material. The second mask defines a second feature corresponding to the angled portion. The method includes depositing a reflective material through the second mask onto the angled portion.

In a second aspect, a method is provided. The method includes depositing a photoresist material on a substrate and overlaying a first mask on the photoresist material, wherein the first mask defines a first feature. The method also includes overlaying a second mask on the first mask. The second mask defines a second feature. The method additionally includes causing a light source to illuminate the photoresist material through the first mask and the second mask. The light source is positioned at a first angle. The first angle includes a non-normal angle with respect to a plane parallel to the substrate. The method also includes removing the second mask and overlaying a third mask on the first mask. The third mask defines a third feature. The method yet further includes causing the light source to illuminate the photoresist material through the third mask and the first mask. The method additionally includes developing the photoresist material so as to retain an elongate portion of the photoresist material on the substrate. A first end of the elongate portion includes an angled portion. The angled portion is sloped at an angle with respect to a long axis of the elongate portion. The method also includes overlaying a fourth mask on the developed photoresist material. The fourth mask defines a fourth feature to correspond to the angled portion The method yet further includes depositing a reflective material through the fourth mask onto the angled portion.

Other aspects, embodiments, and implementations will become apparent to those of ordinary skill in the art by reading the following detailed description, with reference where appropriate to the accompanying drawings.

DETAILED DESCRIPTION

Figure 1A:
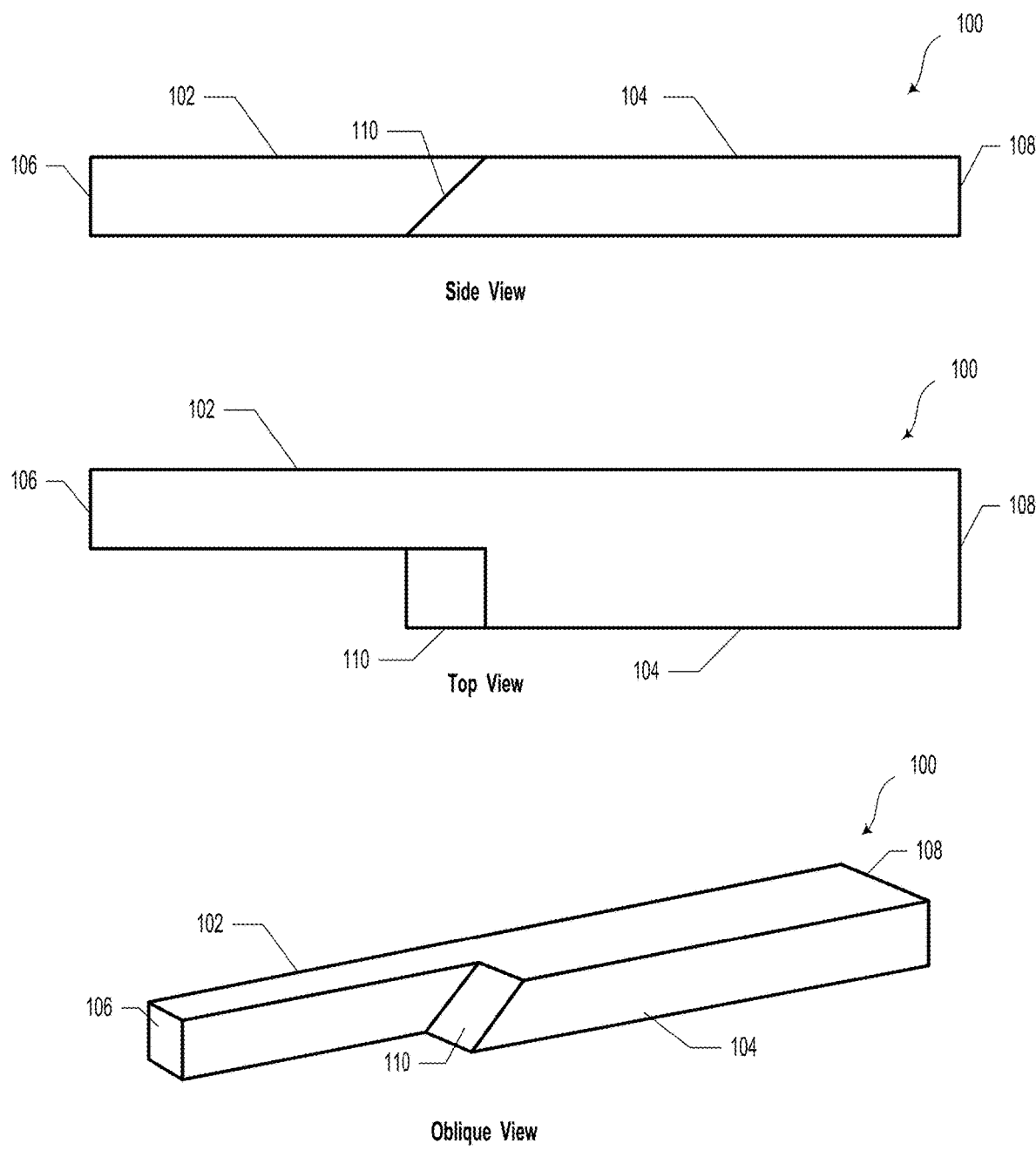
FIG. 1A illustrates an optical element, according to an example embodiment.

Example methods, devices, and systems are described herein. It should be understood that the words "example"

and "exemplary" are used herein to mean "serving as an example, instance, or illustration." Any embodiment or feature described herein as being an "example" or "exemplary" is not necessarily to be construed as preferred or advantageous over other embodiments or features. Other embodiments can be utilized, and other changes can be made, without departing from the scope of the subject matter presented herein.

Thus, the example embodiments described herein are not meant to be limiting. Aspects of the present disclosure, as generally described herein, and illustrated in the figures, can be arranged, substituted, combined, separated, and designed in a wide variety of different configurations, all of which are contemplated herein.

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment.

I. Overview

Systems and methods described herein relate to the manufacture of elements of an optical system. Namely, various processing techniques could be utilized to form one or more light guides of the optical system. The light guides could include an elongate portion that extends along a surface of a substrate. The light guides may also include an angled portion coated with a metal that is optically reflective. In an example embodiment, the light guides may be formed from SU-8 resist and may be configured to guide infrared light.

Processing techniques to form the one or more light guides described herein may include performing a double exposure of a photoresist. For example, a first exposure may be made at a near-normal angle and the second exposure may be provided at an oblique angle with respect to the photoresist surface. The double exposure may help provide the angled portion due to an angled dose profile. Optionally, one or both exposures of the double exposure method could be performed using immersion lithography.

Another processing technique described herein includes a "blur mask" approach, which may be utilized when two photomasks are overlaid on the substrate at the same time. A first exposure may be performed through the two photomasks. Subsequently, the top photomask could be changed out for a photomask that provides a different pattern of openings onto the substrate. In such a scenario, a second exposure could be performed, which may provide a controllable dose profile. The controllable dose profile may be adjusted to form the angled portion of the light guide.

In yet another processing technique, UV light could be controllably "painted" through a slit or another type of aperture and may expose the photoresist-covered substrate at an oblique angle. In such a scenario, the corresponding dose profile may be angled, which may be utilized to provide the angled portion of the light guide. In further embodiments, fabrication methods for producing light guides may include various combinations of the above-mentioned processing techniques.

II. Example Optical Elements and Optical Systems

FIG. 1A illustrates an optical element 100, according to an example embodiment. In some cases, the optical element 100 may be formed from a polymeric material, such as photoresist. For example, the polymeric material may include SU-8 polymer, Kloe K-CL negative photoresist, Dow PHOTOPOSIT negative photoresist, or JSR negative tone THB photoresist. It will be understood that the optical element 100 may be formed from other polymeric photo-patternable materials.

In some embodiments, the optical element 100 may include an elongate structure. The elongate structure may include a first light guide portion 102 and a second light guide portion 104. The second light guide portion 104 may be wider in at least one dimension than the first light guide portion 102. In an example embodiment, the optical element 100 may include an angled portion 110. The optical element 100 may additionally include a first end facet 106 and a second end facet 108. While FIG. 1A illustrates the optical element 100 as having a certain shape, other shapes are possible and contemplated herein.

In example embodiments, the optical element 100 may be configured to guide light. For example, optical element 100 may be configured to couple light from a light source via the first end facet 106. Such light may be guided within at least a portion of optical element 100 via total internal reflection. In some embodiments, at least a portion of the light may be coupled out of the optical element via second end facet 108.

Figure 1B:
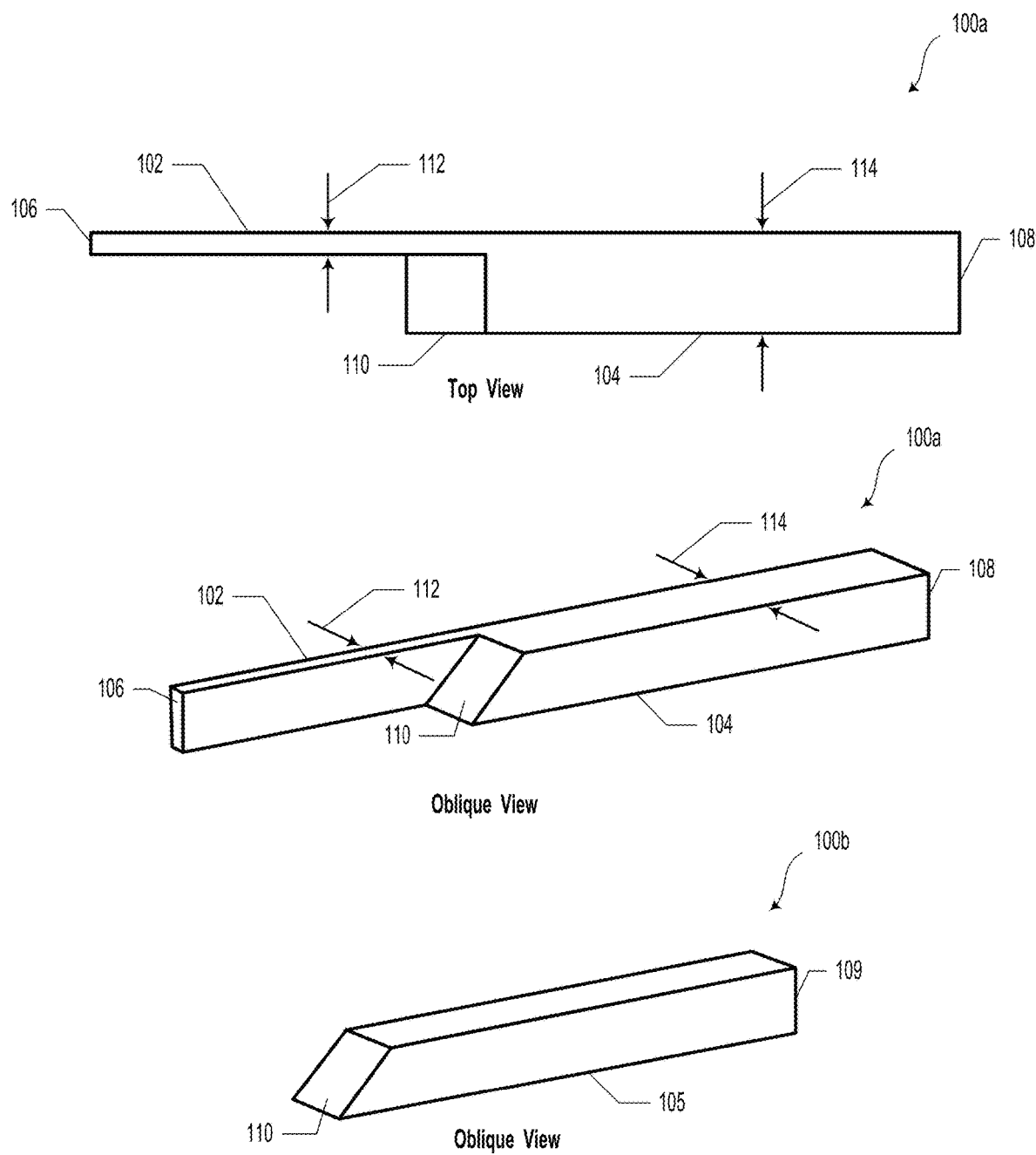
FIG. 1B illustrates optical elements, according to example embodiments.

FIG. 1B illustrates optical elements 100a and 100b, according to example embodiments. Optical element 100a may be similar to optical element 100. For instance, the optical element 100a may include a first light guide portion 102 and a second light guide portion 104, and an angled portion 110. The optical element 100a may also include a first end facet 106 and a second end facet 108. In some embodiments, a width 112 of first light guide portion 102 may be smaller than a width 114 of a second light guide portion 104.

Optical element 100b could be similar to optical element 100. For example, optical element 100b may include a light guide portion 105, an angled portion 110 and an end facet 109. The optical systems and methods of manufacture described herein may include optical elements 100, 100a, and/or 100b.

In some embodiments, the angled portion 110 of the optical elements 100, 100a, and 100b may include a reflective material. For example, the angled portion 110 may include a metallic coating. In some embodiments, the metallic coating may include one or more metals such as titanium, platinum, gold, silver, aluminum, and/or another type of metal. In some other embodiments, the angled portion 110 may include a dielectric coating and/or a dielectric stack.

Figure 1C:
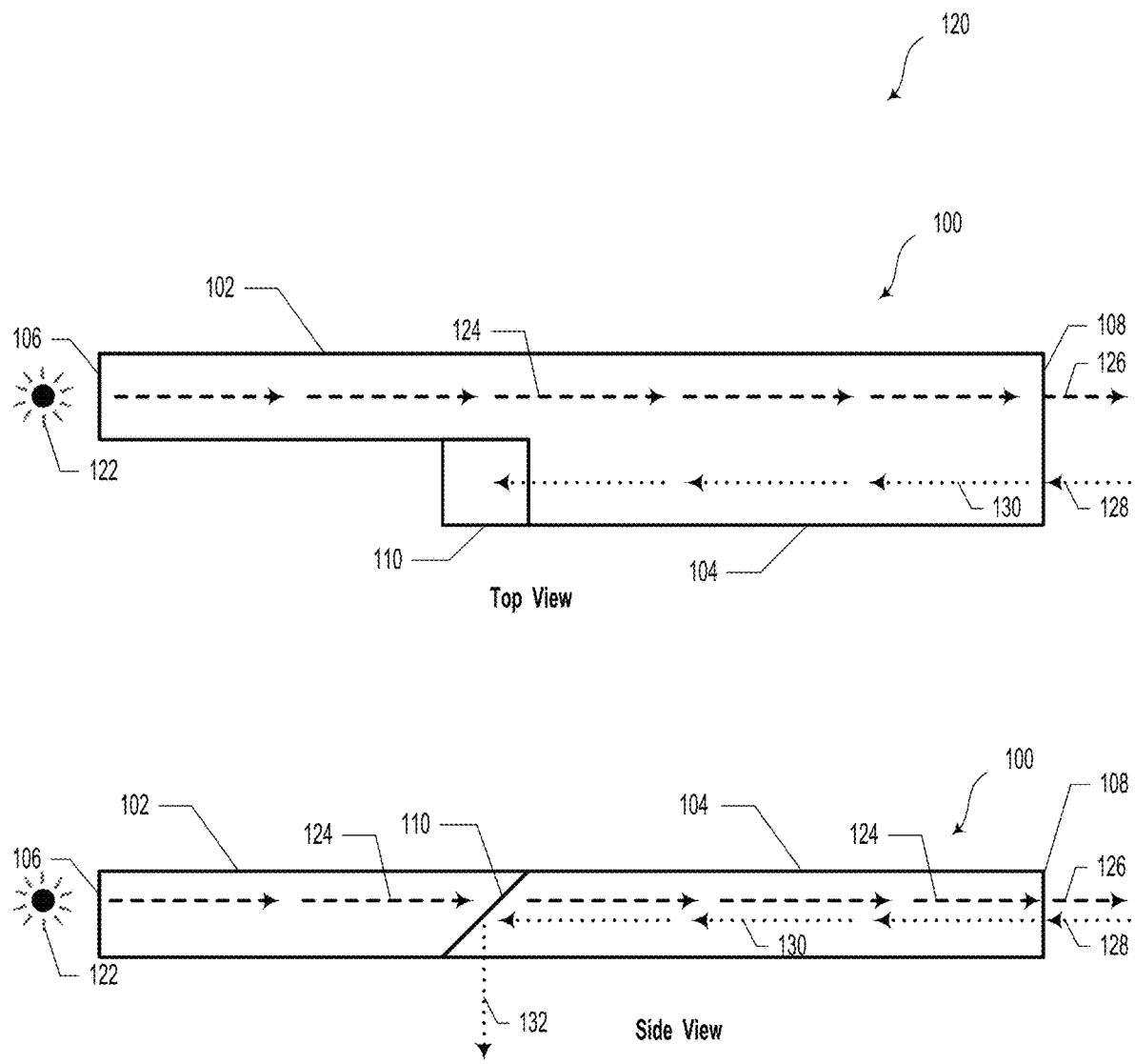
FIG. 1C illustrates an optical element, according to an example embodiment.

FIG. 1C illustrates an optical element 120, according to an example embodiment. Optical element 120 may be similar or identical to optical element 100 as illustrated and described in relation to FIG. 1A. In an example embodiment, a light source 122 may emit light that may be coupled (e.g., via a first end facet 106) into a first light guide portion 102 as coupled emission light 124. The coupled emission light 124 may be outcoupled to an environment via a second end facet 108. The outcoupled light may include transmitted light 126, which may interact with objects in the environment (e.g., via reflection, absorption, and/or refraction). At least a portion of the transmitted light 126 may be reflected or otherwise redirected toward the optical element 120 as received light 128.

In some embodiments, at least a portion of the received light 128 may be coupled into the optical element 120 via the second end facet 108 as coupled received light 130. The coupled received light 130 may be guided within the optical element 120 toward an angled portion 110. In some embodiments, the angled portion 110 may be configured to reflect at least a portion of the coupled received light 130 as reflected light 132. In some embodiments, reflected light 132 may be directed in an out-of-plane direction with respect to a respective light propagation direction (or vector) of the coupled emission light 124 and/or the coupled received light 130.

Figure 1D:
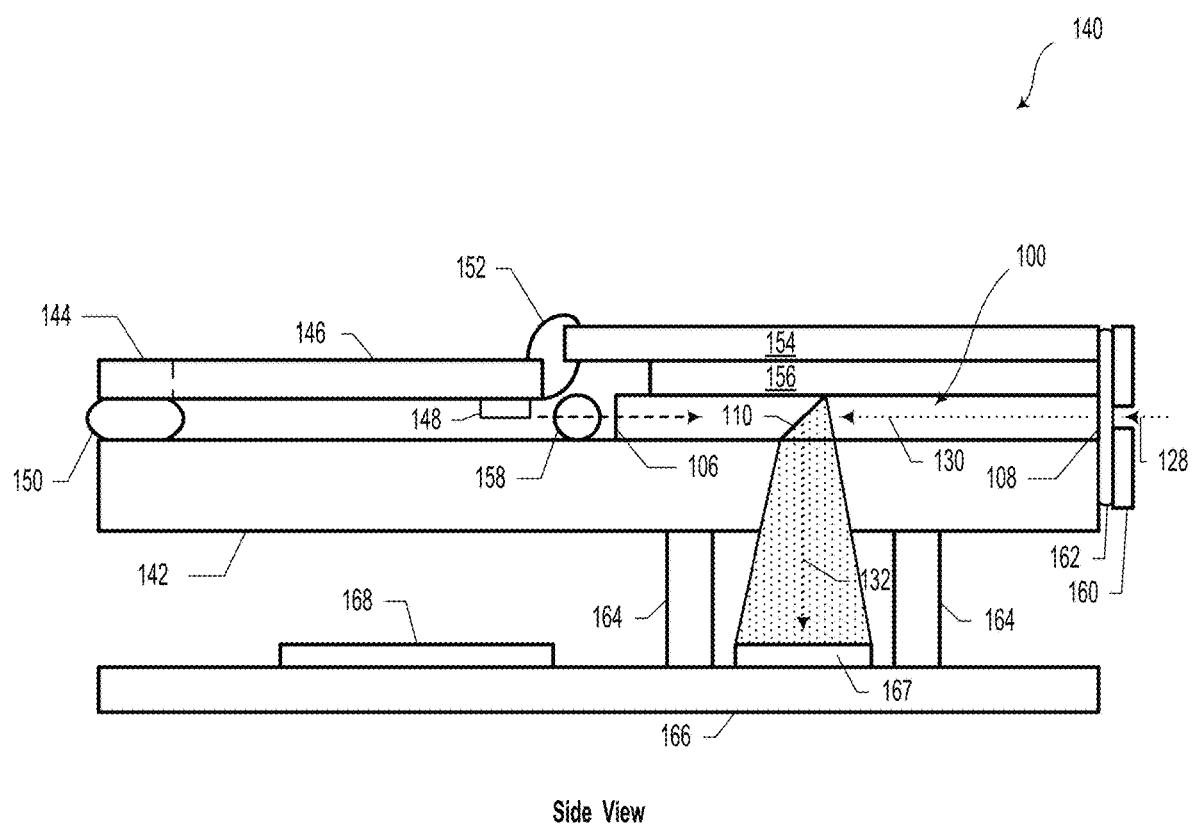
FIG. 1D illustrates an optical system, according to an example embodiment.
Figure 1E:
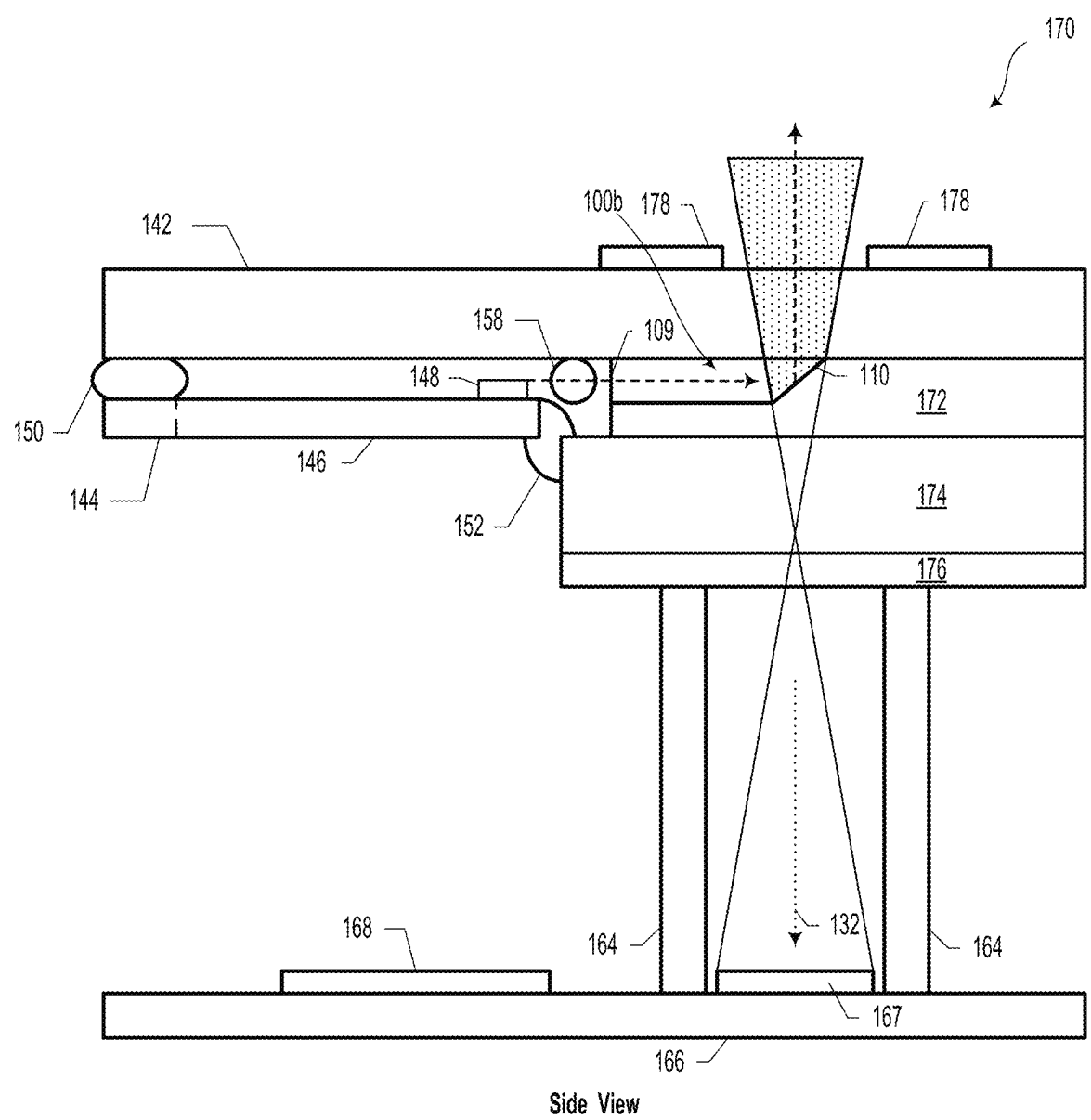
FIG. 1E illustrates an optical system, according to an example embodiment.
Figure 1F:
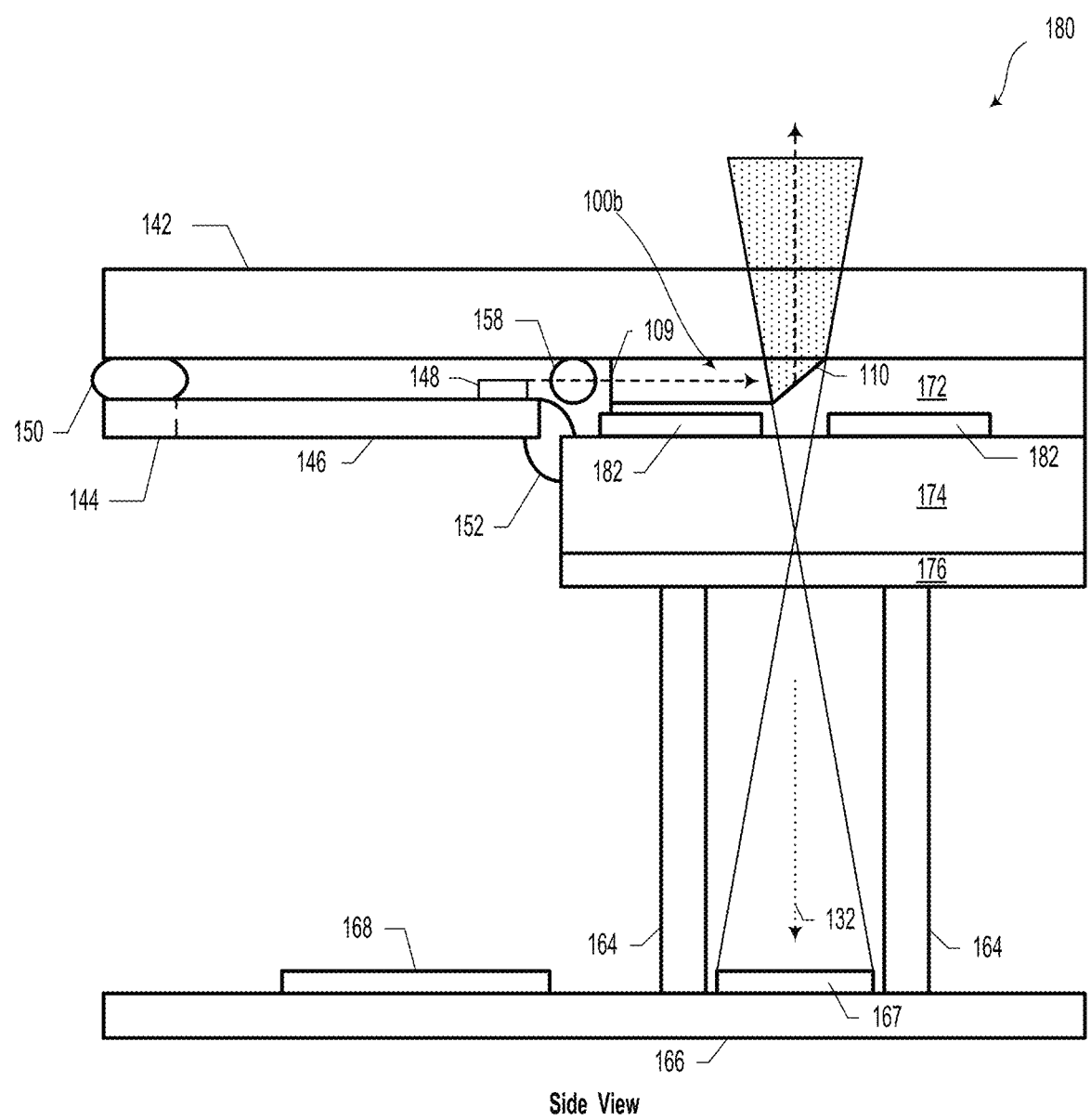
FIG. 1F illustrates an optical system, according to an example embodiment.

FIGS. 1D-1F illustrate several different optical systems 140, 170, and 180, which may describe different compact LIDAR systems that incorporate optical light guide elements. Such LIDAR systems may be configured to provide information (e.g., point cloud data) about one or more objects (e.g., location, shape, etc.) in a given environment. In an example embodiment, the LIDAR system could provide point cloud information, object information, mapping information, or other information to a vehicle. The vehicle could be a semi- or fully-automated vehicle. For instance, the vehicle could be a self-driving car, an autonomous drone aircraft, an autonomous truck, or an autonomous robot. Other types of vehicles and LIDAR systems are contemplated herein.

FIG. 1D illustrates an optical system 140, according to an example embodiment. The optical system 140 is one of a variety of different optical systems that may include light guides such as optical element 100, as illustrated and described in reference to FIG. 1A. In an example embodiment, optical element 100 may be coupled to a transparent substrate 142. The optical element 100 may be coupled to a further transparent substrate 154 via an optical adhesive 156.

The optical system 140 may include a laser assembly that includes a substrate 144, one or more elongate structures 146, and one or more laser bars 148, each of which is coupled to a respective elongate structure. In some embodiments, the substrate 144 may be coupled to the transparent substrate 142 with an epoxy material 150. Additionally or alternatively, the substrate 144 and/or the elongate structures 146 may be coupled to the further transparent substrate 154 via an epoxy material 152. Other ways to fix the one or more laser bars 148 to the transparent substrate 142 are possible and contemplated herein.

The one or more laser bars 148 may be configured to emit light towards a cylindrical lens 158, which may help focus, defocus, direct, and/or otherwise couple the emitted light into the optical element 100.

The optical system 140 may additionally or alternatively include a further substrate 166. In some embodiments, a controller 168 and at least one photodetector 167 may be coupled to the further substrate 166. Furthermore, the further substrate 166 can be coupled to the transparent substrate 142 via one or more light shields 164. In an example embodiment, the light shields 164 could be "honeycomb" type optical baffles or another type of opaque material. In such scenarios, the reflected light 132 may be detected by the at least one photodetector 167. In some embodiments, the at least one photodetector 167 may include silicon photomultipliers (SiPMs), avalanche photodiodes (APD), or another type of photo sensors, which may be arranged in a linear or areal array.

In some embodiments, the optical system 140 may include an aperture plate 160, which may be coupled to the transparent substrate 142 and/or the optical element 100 via an optical adhesive 162. In some embodiments, the optical adhesive 162 may be index-matched to an index of refraction of the optical element 100, optical adhesive 156, and/or other elements of optical system 140. In some embodiments, the aperture plate 160 may include a plurality of apertures, which could be, for example, openings or holes in a metal plate.

Furthermore, while FIG. 1D illustrates a single laser bar 148, a single optical element 100 and a single photodetector 167, it is understood that a plurality of such elements is possible and contemplated herein. For example, some embodiments may include 256 laser bars, 256 optical elements, and a corresponding number of photodetectors.

FIG. 1E illustrates an optical system 170, according to an example embodiment. Optical system 170 may include similar or identical elements as those of optical system 140 as illustrated and described in relation to FIG. 1D. In some embodiments, an optical element 100b may be coupled to a transparent substrate 142. The optical element 100b may be encapsulated or otherwise coupled to optical adhesive 172 and/or a further transparent substrate 174. A filter 176 may be coupled to the further transparent substrate 174. The filter 176 may be configured to filter wavelengths of light that are different from those emitted by laser bar 148. That is, in an example embodiment, filter 176 may include a bandpass filter configured to pass emission light from the laser bar 148.

In some embodiments, an aperture plate 178 may be coupled to the transparent substrate 142. For example, the aperture plate 178 may include a plurality of openings.

FIG. 1F illustrates an optical system 180, according to an example embodiment. The optical system 180 may include elements that are similar or identical to those of optical system 170, as illustrated and described in relation to FIG. 1E. Furthermore, an aperture plate 182 may be provided between a further transparent substrate 174 and the optical element 100.

In some embodiments, the photodetector 167 could include a complementary metal-oxide semiconductor (CMOS) image sensor. Additionally or alternatively, the photodetector 167 may include at least one of a silicon photomultiplier (SiPM), a linear mode avalanche photodiode (LMAPD), a PIN diode, a bolometer, and/or a photoconductor. It will be understood that other types of photodetectors (and arrangements thereof) are possible and contemplated herein.

The controller 168 of optical systems 140, 170, and 180 includes a memory and at least one processor. The at least one processor may include, for instance, an application-specific integrated circuit (ASIC) or a field-programmable gate array (FPGA). Other types of processors, computers, or devices configured to carry out software instructions are contemplated herein. The memory may include a non-transitory computer-readable medium, such as, but not limited to, read-only memory (ROM), programmable read-only memory (PROM), erasable programmable read-only memory (EPROM), electrically erasable programmable read-only memory (EEPROM), non-volatile random-access memory (e.g., flash memory), a solid state drive (SSD), a hard disk drive (HDD), a Compact Disc (CD), a Digital Video Disk (DVD), a digital tape, read/write (R/W) CDs, R/W DVDs, etc.

In some embodiments, the optical systems 140, 170, and 180 may be LIDAR systems configured to provide information indicative of objects within an environment of the optical system. As such, in some cases, the optical systems 140, 170, and/or 180 may be disposed on a vehicle, such as a self-driving car, a self-driving truck, a drone aircraft, and/or a drone boat. Other types of vehicles are possible and contemplated herein.

III. Example Methods

FIGS. 2A-2K illustrate various blocks of a method of manufacture, according to one or more example embodiments. It will be understood that at least some of the various blocks may be carried out in a different order than of that presented herein. Furthermore, blocks may be added, subtracted, transposed, and/or repeated. FIGS. 2A-2K may serve as example illustrations for at least some of the blocks or steps described in relation to methods 300 and 400 as illustrated and described in relation to FIGS. 3 and 4, respectively. Additionally, some blocks of FIGS. 2A-2K may be carried out so as to provide optical elements 100, 100a, 100b, 120, and/or optical systems 140, 170, and 180, as illustrated and described in reference to FIGS. 1A-1F.

Figure 2A:
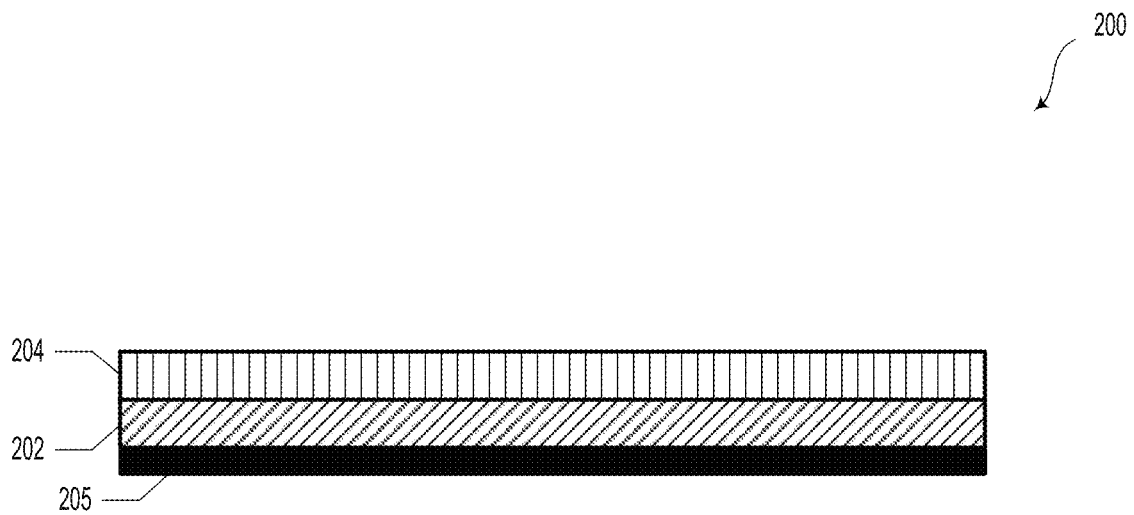
FIG. 2A illustrates a block of a method of manufacture, according to an example embodiment.

FIG. 2A illustrates a block 200 of a method of manufacture, according to an example embodiment. Block 200 includes preparing a photo-patternable material 204 on a transparent substrate 202. In some embodiments, the photo-patternable material 204 may include a photoresist or any other photo-patternable material described herein. In such scenarios, preparing the photo-patternable material 204 may include depositing photoresist by a spinning it onto the transparent substrate 202 followed by baking the photoresist.

In some embodiments, the transparent substrate 202 may include glass or another transparent material. Furthermore, in some embodiments, the transparent substrate 202 may be coupled to an opaque material 205. The opaque material 205 may include an optical absorber material.

Figure 2B:
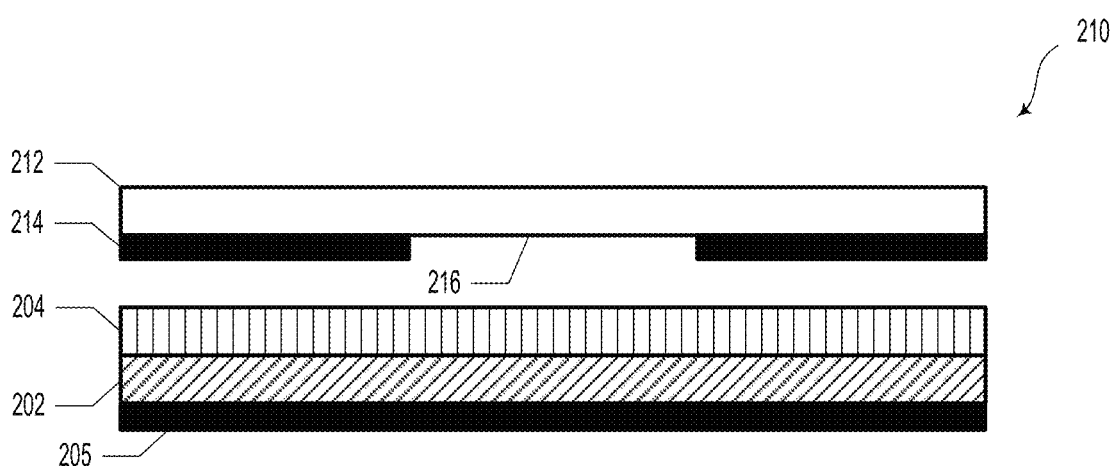
FIG. 2B illustrates a block of a method of manufacture, according to an example embodiment.

FIG. 2B illustrates a block 210 of a method of manufacture, according to an example embodiment. As illustrated, a mask 212 may be brought into close proximity or direct contact with the photo-patternable material 204. Mask 212 may include a photolithography mask plate, a shadow mask, or another type of physical or virtual lithography mask. As an example, mask 212 may include opaque features 214 and transparent features 216. The combination of opaque features 214 and transparent features 216 may define various shapes or other features that may be transferred into the photo-patternable material 204.

Figure 2C:
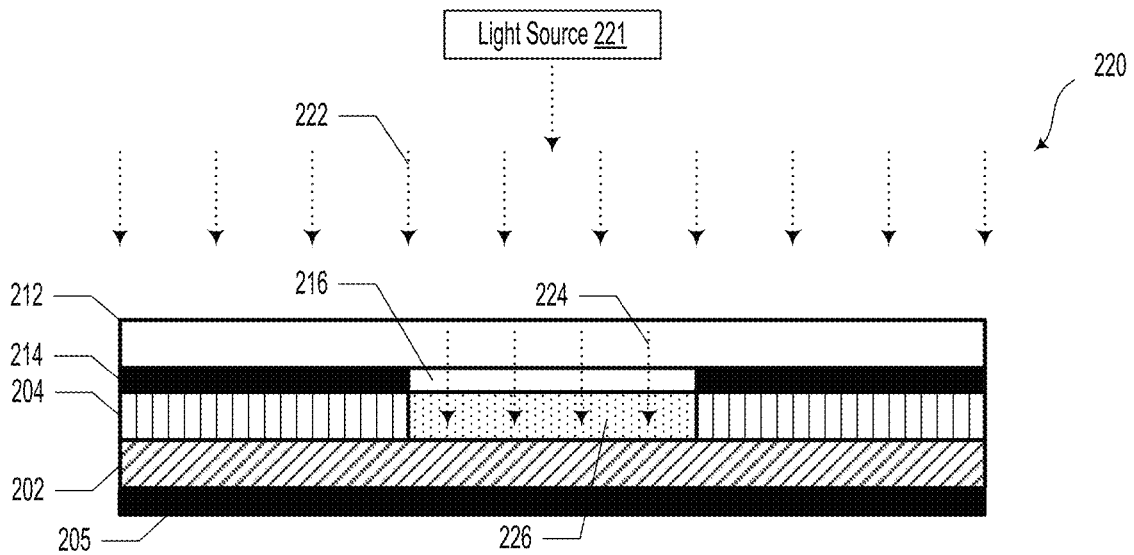
FIG. 2C illustrates a block of a method of manufacture, according to an example embodiment.

FIG. 2C illustrates a block 220 of a method of manufacture, according to an example embodiment. Block 220 includes causing a light source 221 to illuminate the mask 212 and at least a portion of the photo-patternable material 204 so as to expose at least a first feature 226. For example, the light source 221 may emit illumination light 222 by way of a substantially uniform illumination intensity across the mask 212. Based on the combination of opaque features 214 and transparent features 216, exposure light 224 may interact with the first feature 226 of the photo-patternable material 204.

Figure 2D:
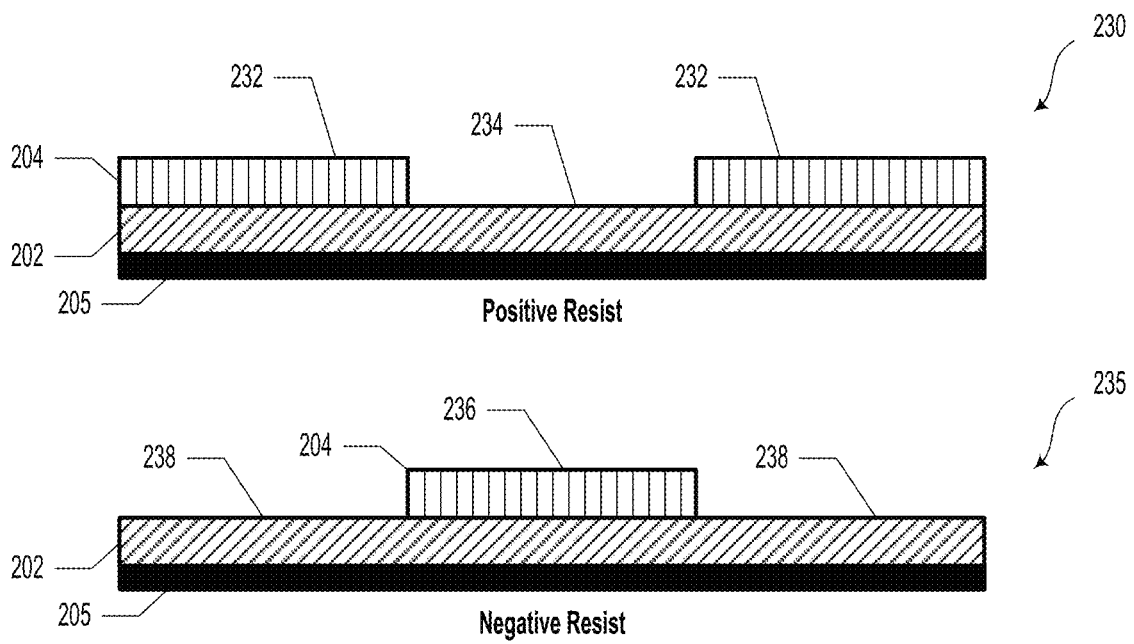
FIG. 2D illustrates blocks of a method of manufacture, according to example embodiments.

FIG. 2D illustrates block 230 and block 235 from a method of manufacture, according to example embodiments. Namely, blocks 230 and 240 may illustrate cross-sectional profiles upon development of respective types of photo-patternable material. For example, block 230 may occur in the case of using a positive-tone photo-patternable resist, while block 240 may occur in scenarios where a negative-tone photo-patternable resist is used.

Referring to block 230, after exposure of first feature 226 and development of the photo-patternable material 204, the first feature 226 may be removed to reveal a surface 234 of the transparent substrate 202. Furthermore, resist features 232 may remain after resist development.

Referring to block 240 (e.g., the negative-tone resist scenario), the remaining resist feature 236 may include the exposed first feature 226. Accordingly, after development, surfaces 238 may be revealed after resist development.

It will be understood that other feature sizes, shapes, and contours are possible. All other such alternatives are contemplated herein.

Figure 2E:
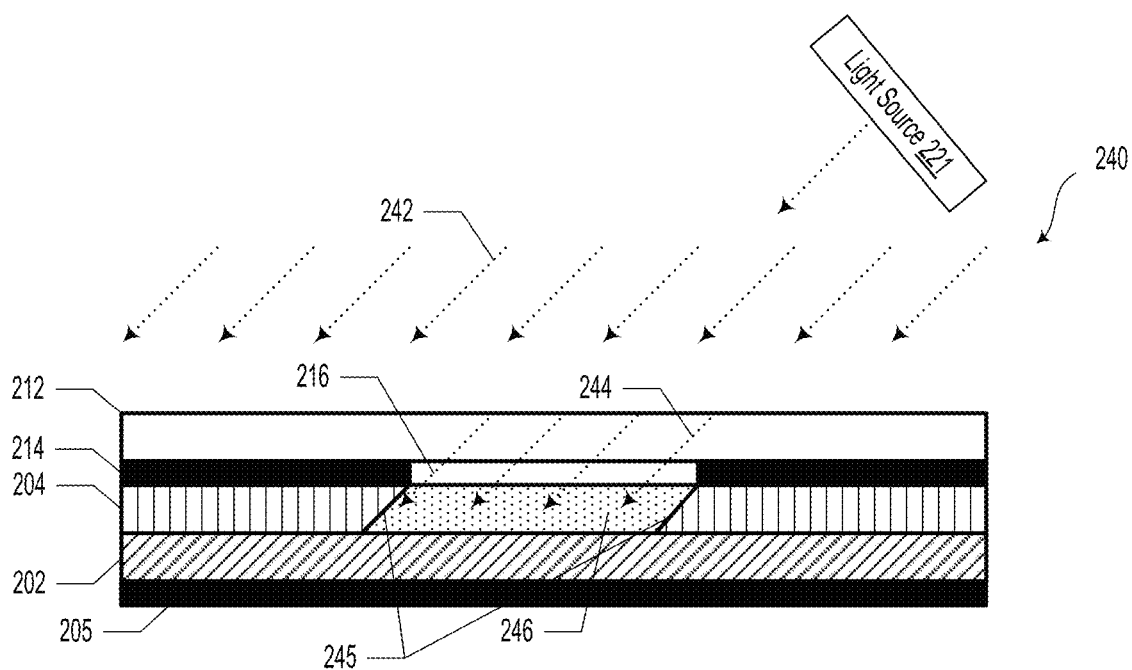
FIG. 2E illustrates a block of a method of manufacture, according to an example embodiment.

FIG. 2E illustrates a block 240 of a method of manufacture, according to an example embodiment. Block 240 includes causing light source 221 to illuminate a mask 212 and at least a portion of the photo-patternable material 204 so as to expose at least a first feature 246 as well as one or more angled portions 245. As illustrated in FIG. 2E, the light source 221 provide illumination light 242 that is incident at a non-normal angle with respect to a plane of the transparent substrate 204 and/or the mask 212. In some embodiments, a slope angle of the angled portions 245 may be based on an angle of the exposure light 244. For instance, in an example embodiment, a resulting structure (e.g., after photoresist development) could include a three-dimensional parallelogram shape.

While not illustrated in FIG. 2E, it will be understood that the lithography steps or blocks described herein may be provided using immersion lithography. That is, the mask 212 and the transparent substrate 202 could be submerged in a liquid with a refractive index that is different from that of air. In such a scenario, an angle of incidence of the illumination light 242 may be different than the slope angle of the angled portion 245 and the exposure light 244. For example, the angle of incidence of the exposure light 244 may be within an inclusive angle range between 15 to 45 degrees from normal incidence. It will be understood that other angles are possible and dynamically varying angles of incidence of the illumination light 242 are possible as well.

Figure 2F:
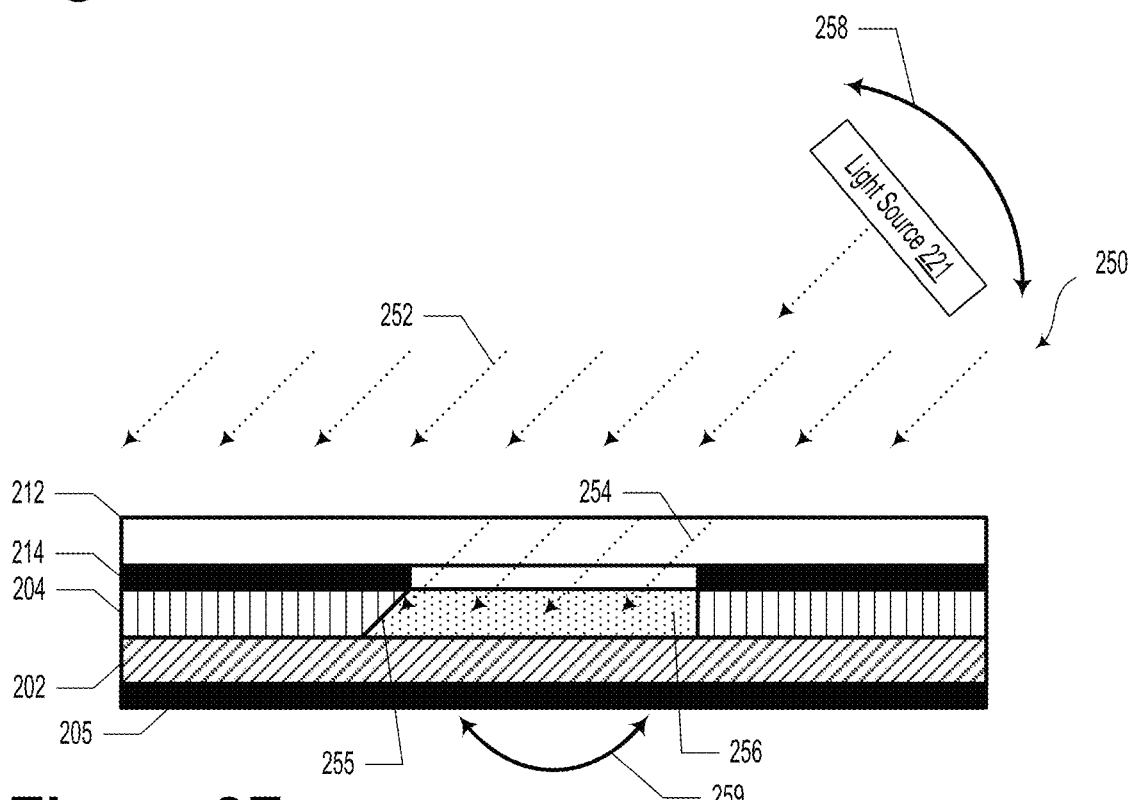
FIG. 2F illustrates a block of a method of manufacture, according to an example embodiment.

FIG. 2F illustrates a block 250 of a method of manufacture, according to an example embodiment. As illustrated in block 250, a position and/or an orientation 258 of the light source 221 may be adjusted (between exposures and/or dynamically during exposure) with respect to the transparent substrate 202 and the mask 212. In such scenarios, respective incidence angles of the illumination light 252 and the exposure light 254 may be based on the orientation 258 of the light source 221.

Additionally or alternatively, a location and/or an orientation 259 of the transparent substrate 202 may be adjusted (between exposures and/or dynamically during exposure) with respect to the light source 221.

Figure 2G:
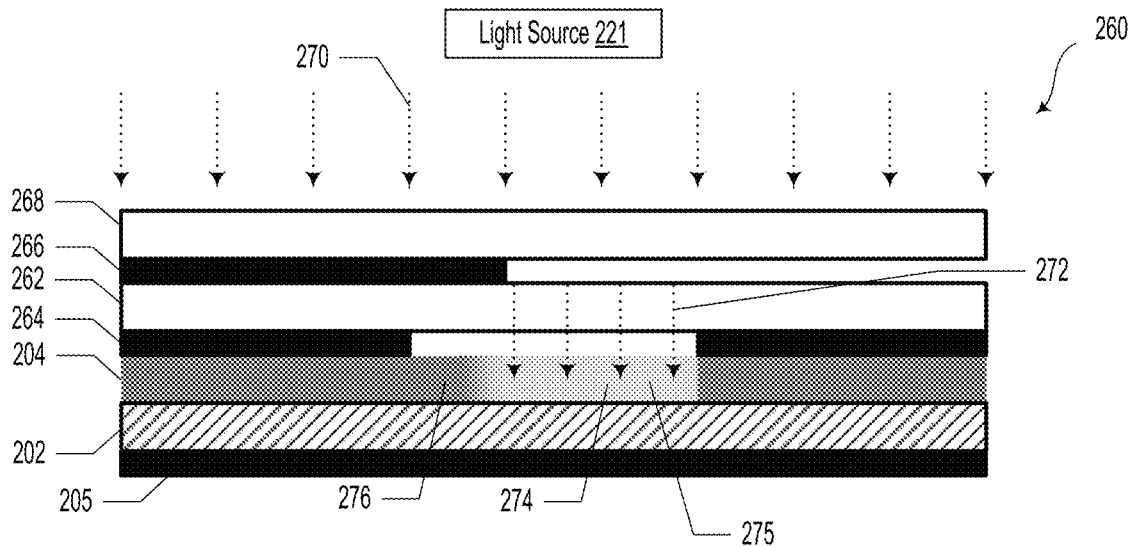
FIG. 2G illustrates a block of a method of manufacture, according to an example embodiment.

FIG. 2G illustrates a block 260 of a method of manufacture, according to an example embodiment. As illustrated, block 260 includes causing light source 221 to emit illumination light 270 so as to interact with a first mask 262 and a second mask 268. Namely, first mask 262 may include opaque features 264, which may be different in size, shape, and/or orientation as compared to opaque features 266 of the second mask 268. Upon interactions with the first mask 262 and the second mask 268, exposure light 272 may impinge on the photo-patternable material 204 so as to expose a first feature 274.

In some embodiments, the first mask 262, second mask 268, and exposure light 272 may interact so as to provide a difference in light exposure along the first feature 274. That is, in some cases, a first portion 275 of the photo-patternable material 204 may be may be exposed with more exposure light 272 than a second portion 276 of the photo-patternable material 204. In such scenarios, the different light exposure amounts may be utilized to form the first feature 274. For example, it will be understood that analog, or grayscale, lithography may be applied so as to form the first feature 274.

Figure 2H:
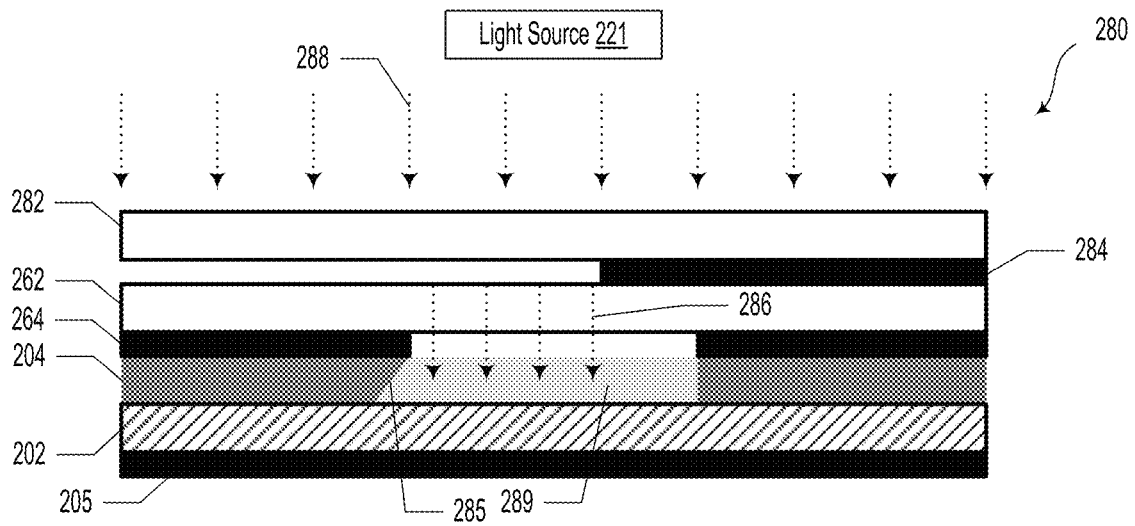
FIG. 2H illustrates a block of a method of manufacture, according to an example embodiment.

FIG. 2H illustrates a block 280 of a method of manufacture, according to an example embodiment. Block 280 may include causing light source 221 to emit illumination light 288. The illumination light 288 may interact with a first mask 262 and a third mask 282. The first mask 262 and the third mask 282 may include respective opaque features 264 and 284.

Upon interaction with the first mask 262 and the third mask 282, exposure light 286 may impinge on at least a portion 289 of the photo-patternable material 204. The portion 289 may include an angled portion 285.

Figure 2I:
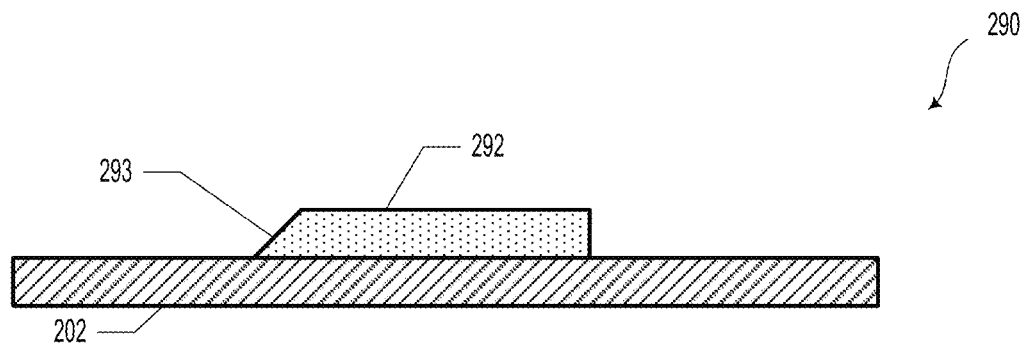
FIG. 2I illustrates a block of a method of manufacture, according to an example embodiment.

FIG. 2I illustrates a block 290 of a method of manufacture, according to an example embodiment. Block 290 illustrates an elongate portion 292 of the photo-patternable material that remains following chemical development of the resist. The elongate portion 292 may include an angled portion 293. It will be understood that block 290 could be conducted after one or more exposures as described herein. That is, block 290 may be performed after exposure with exposure light 224, exposure light 244, exposure light 254, exposure light 272, and/or exposure light 286. Furthermore, while block 290 illustrates a single layer of developed photo-patternable material, it will be understood that the elongate portion 292 may be provided using a plurality of layers of photo-patternable materials and subsequent exposure and development steps. In other words, the elongate portion 292 may be provided using multiple additive steps, such as building up multiple resist layers and conducting respective multiple exposure and development steps. Other ways to manufacture the elongate portion 292 using semiconductor lithography techniques are possible and contemplated herein.

Figure 2J:
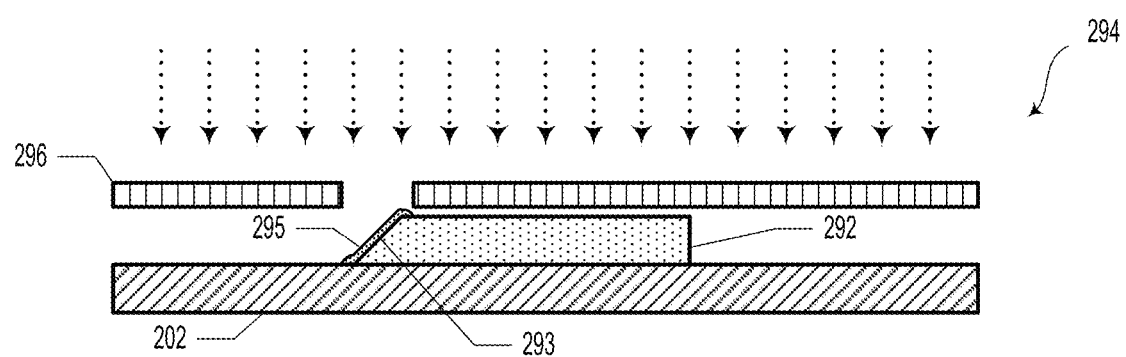
FIG. 2J illustrates a block of a method of manufacture, according to an example embodiment.

FIG. 2J illustrates a block 294 of a method of manufacture, according to an example embodiment. As illustrated in FIG. 2J, a shadow mask 296 may be aligned to correspond with the angled portion 293 of the elongate portion 292. Furthermore, metal 295 may be deposited through the shadow mask 296 so as to form an optically reflective surface on the angled portion 293. FIG. 2J illustrates metal 295 as being deposited along a normal or near-normal path with respect to the substrate 202. However, it will be understood that, other deposition orientations and other conditions are possible. For example, metal could be deposited through the shadow mask 296 at an angle that is normal with respect to the angled portion 293. Other deposition angles are possible.

Figure 2K:
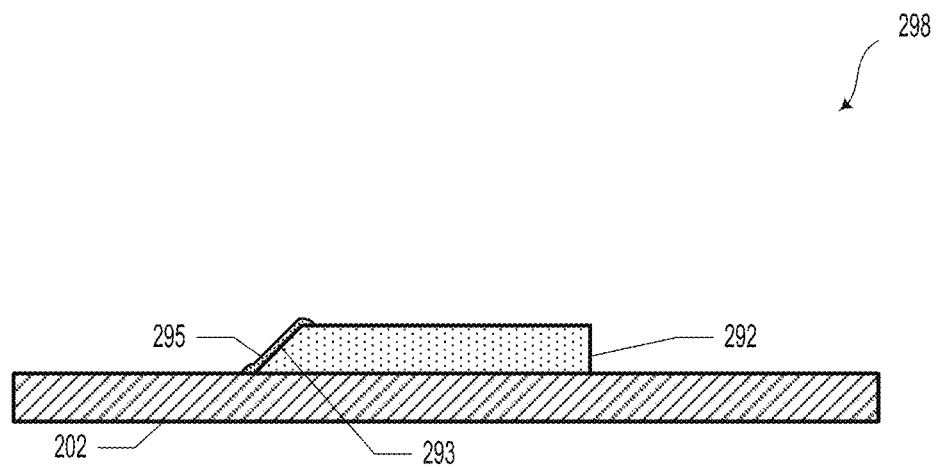
FIG. 2K illustrates a block of a method of manufacture, according to an example embodiment.

FIG. 2K illustrates a block 298 of a method of manufacture, according to an example embodiment. Block 298 illustrates the elongate portion 292 of the remaining photo-patternable material. The elongate portion 292 includes an angled portion 293 that has been coated with a metal 295 so as to form a reflective surface. Namely, for light that is guided within the elongate portion 292, the metal 295 may be utilized so as to reflect light out of a plane that includes the elongate portion 292.

Figure 3:
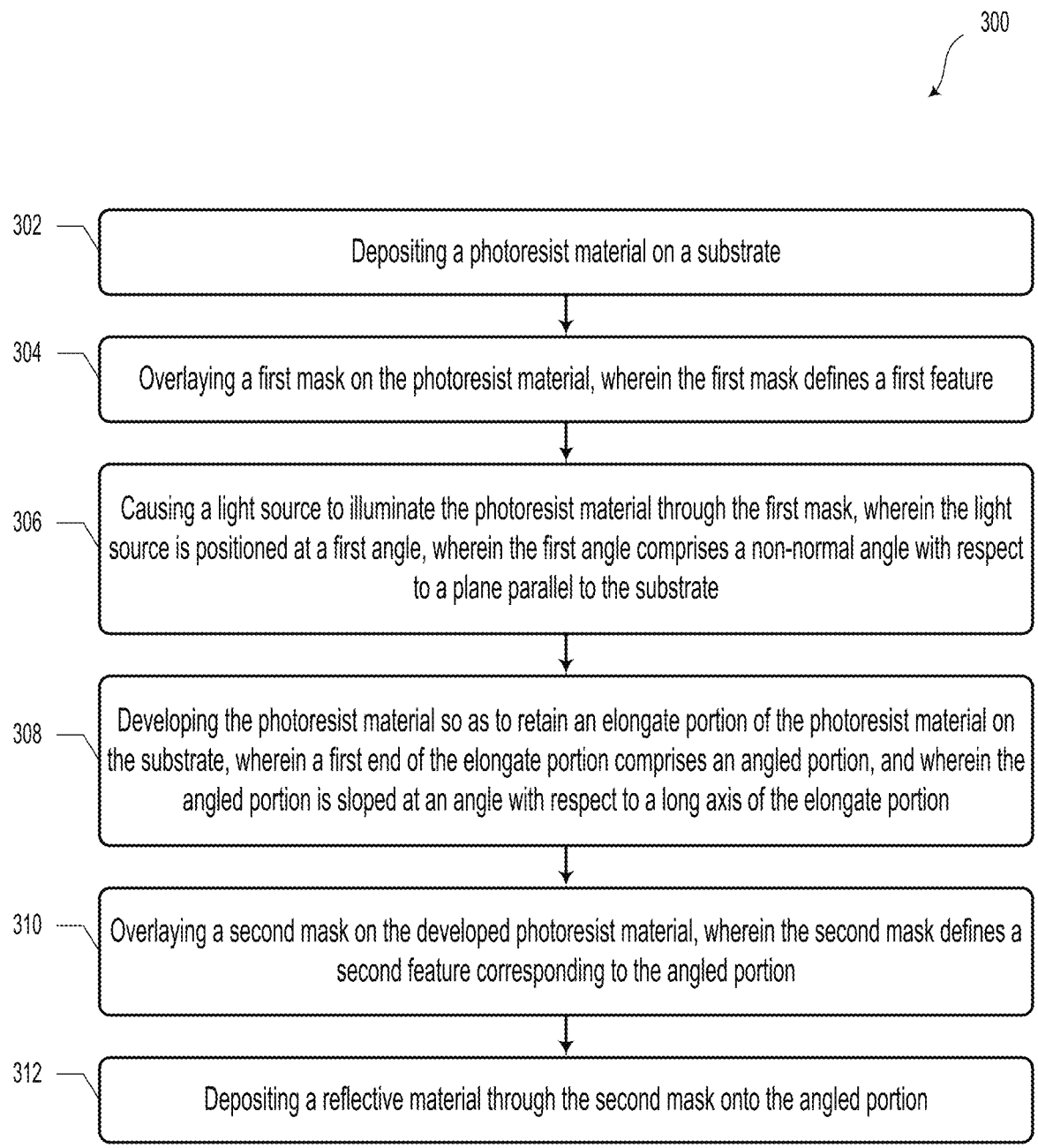
FIG. 3 illustrates a method, according to an example embodiment.

FIG. 3 illustrates a method 300, according to an example embodiment. Method 300 may be carried out, at least in part, by way of some or all of the manufacturing steps or blocks illustrated and described in reference to FIGS. 2A-2K. It will be understood that the method 300 may include fewer or more steps or blocks than those expressly disclosed herein. Furthermore, respective steps or blocks of method 300 may be performed in any order and each step or block may be performed one or more times.

Block 302 includes depositing a photoresist material on a substrate. In some example embodiments, depositing the photoresist material on the substrate may include depositing a negative SU-8 resist on the substrate. The substrate could be a transparent material, such as glass.

Block 304 includes overlaying a first mask on the photoresist material. In some embodiments, the first mask defines a first feature. In such scenarios, the first feature may be defined in either dark field or clear field tone. As an example, the first mask may include one or more rectangular openings or opaque features. It will be understood that other shapes are possible and contemplated herein.

Block 306 includes causing a light source to illuminate the photoresist material through the first mask during a first exposure. In such a scenario, the light source is positioned at a first angle, which can include a non-normal angle with respect to a plane parallel to the substrate.

In example embodiments, the light source may be optically coupled to a collimating lens. Furthermore, the light source may be an ultraviolet (UV) light source. The light source could part of a photolithography stepper or contact lithography system. Other types of photolithography systems are contemplated and possible.

In some cases, method 300 may additionally include causing the light source to illuminate the photoresist material through the first mask during a second exposure. In such scenarios, the second exposure may include the light source being positioned at a second angle with respect to the plane parallel to the substrate.

Additionally or alternatively, some embodiments of method 300 may include, while causing the light source to illuminate the photoresist material through the first mask (e.g., during the first exposure or the second exposure), adjusting a position of the substrate with respect to the light source. That is, while exposing the photoresist, the method 300 may include: 1) moving the light source with respect to a fixed position of the first mask and substrate; 2) moving the first mask and substrate with respect to a fixed position of the light source; or 3) moving the light source as well as the first mask and substrate.

In some embodiments, the method 300 may additionally or alternatively include immersing the substrate and the photoresist material in a bath. Such a bath may include a liquid such as water or another type of fluid. In such scenarios, causing the light source to illuminate the photoresist material could include causing the light source to illuminate the photoresist material through at least a portion of the liquid. It will be understood that a variety of different immersion lithography techniques are possible within the context of the present disclosure. All other such immersion lithography techniques are contemplated herein.

Although embodiments herein are described in reference to photolithography by large area exposure, it will be understood that the definition of the optical elements, angled portion, and other structures herein may be provided using, among other techniques, direct write lithography techniques, such as laser direct writing and/or electron beam lithography. All such other techniques are possible and contemplated herein.

Block 308 includes developing the photoresist material so as to retain an elongate portion of the photoresist material on the substrate. For example, a first end of the elongate portion could include an angled portion. The angled portion can be sloped at an angle with respect to a long axis of the elongate portion.

In some embodiments, the elongate portion could be utilized as a light guide manifold. In such scenarios, method 300 may optionally include coupling an aperture plate to the light guide manifold. For example, the aperture plate may include at least one aperture. The at least one aperture can be optically coupled to the light guide manifold. In some scenarios, the aperture plate can be coupled to a distal end of the light guide manifold. As such, method 300 may additionally include coupling a light-emitter device to a proximal end of the light guide manifold.

Block 310 includes overlaying a second mask on the developed photoresist material. In such scenarios, the second mask defines a second feature corresponding to the angled portion. The second mask could include, for example, a shadow mask with one or more openings defining square or rectangular regions corresponding to the angled portion. In an example embodiment, the shadow mask could include one opening for each elongate portion of the photoresist material on the substrate. In such a scenario, the shadow mask could be aligned and then clamped to the substrate prior to metal deposition.

Block 312 includes depositing a reflective material through the second mask onto the angled portion. In some embodiments, the reflective material may include a metal that is optically-reflective in a near-infrared wavelength range. For example, the metal could include titanium, platinum, gold, silver, aluminum, tungsten, or another type of metal, applied individually or in combination.

In other embodiments, overlaying the second mask could include using a photolithography mask plate as part of a second lithography step to form one or more openings in a further layer of photoresist. According to block 312, the reflective material could be deposited through the second mask and the further layer of photoresist could be subsequently removed in a metal lift-off process. It will be understood that other ways to use a shadow or photolithography mask so as to deposit or otherwise form the reflective material along the angled portion are possible and contemplated herein.

Figure 4:
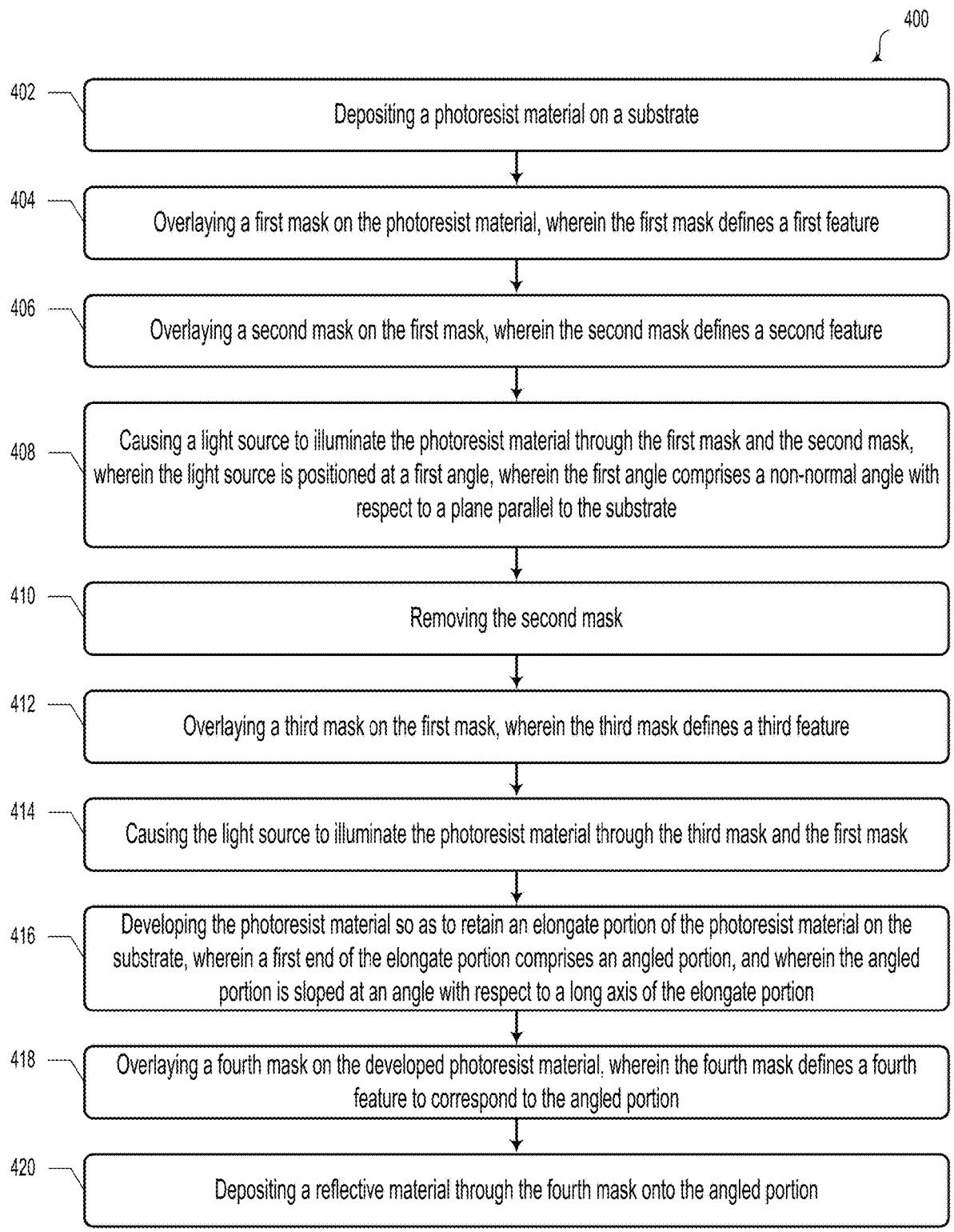
FIG. 4 illustrates a method, according to an example embodiment.

FIG. 4 illustrates a method 400, according to an example embodiment. Method 400 may be carried out, at least in part, by way of some or all of the manufacturing steps or blocks illustrated and described in reference to FIGS. 2A-2K. It will be understood that the method 400 may include fewer or more steps or blocks than those expressly disclosed herein. Furthermore, respective steps or blocks of method 400 may be performed in any order and each step or block may be performed one or more times.

Block 402 includes depositing a photoresist material on a substrate. In some embodiments, depositing the photoresist material on the substrate may include depositing a negative SU-8 resist on the substrate.

Block 404 includes overlaying a first mask on the photoresist material. In such scenarios, the first mask defines a first feature. As described elsewhere herein, the first mask could include a photomask, a mask plate, a shadow mask, or another type of physical or virtual lithographic mask.

Block 406 includes overlaying a second mask on the first mask. In such cases, the second mask defines a second feature. In other words, the second mask could be a photomask that defines at least one different feature from that of the first mask.

Block 408 includes causing a light source to illuminate the photoresist material through the first mask and the second mask. The light source is positioned at a first angle. The first angle forms a non-normal angle with respect to a plane parallel to the substrate.

In some embodiments, while causing the light source to illuminate the photoresist material through the first mask and the second mask, the method 400 may include adjusting a position of the substrate with respect to the light source. Additionally or alternatively, while causing the light source to illuminate the photoresist material through the first mask and the second mask, method 400 could include adjusting a position of the light source with respect to the substrate.

Block 410 includes removing the second mask. The second mask could be removed by physically moving it away from the first mask and the substrate.

Block 412 includes overlaying a third mask on the first mask. The third mask defines a third feature. In other words, the third mask may define features that are at least in part different from the first and/or second features.

Block 414 includes causing the light source to illuminate the photoresist material through the third mask and the first mask. In some embodiments, causing the light source to illuminate the photoresist material through the third mask and the first mask may include a subsequent exposure. During the subsequent exposure, the light source could be positioned at a second angle with respect to the plane parallel to the substrate.

In some cases, while causing the light source to illuminate the photoresist material through the third mask and the first mask, the method 400 may include adjusting a position of the substrate with respect to the light source. Additionally or alternatively, while causing the light source to illuminate the photoresist material through the third mask and the first mask, method 400 could include adjusting a position of the light source with respect to the substrate.

Block 416 includes developing the photoresist material so as to retain an elongate portion of the photoresist material on the substrate. A first end of the elongate portion includes an angled portion, which is sloped at an angle with respect to a long axis of the elongate portion.

In some embodiment, the elongate portion may include a light guide manifold. In such cases, method 400 may include coupling an aperture plate to the light guide manifold. The aperture plate could include a plurality of apertures. At least one aperture of the plurality of apertures could be optically coupled to the light guide manifold. For example, in the case where the substrate includes a plurality of light guide manifolds, each aperture opening may correspond to a respective output facet of a given light guide manifold. The aperture plate may be formed of metal or another optically-opaque material.

In some embodiments, the aperture plate is coupled to a distal end of the light guide manifold. In such scenarios, the method 400 additionally or alternatively could include coupling a light-emitter device to a proximal end of the light guide manifold.

Block 418 includes overlaying a fourth mask on the developed photoresist material. In such a scenario, the fourth mask defines a fourth feature to correspond to the angled portion.

Block 420 includes depositing a reflective material through the fourth mask onto the angled portion. In such scenarios, the reflective material may include a metal that is optically-reflective in a near-infrared wavelength range.

The particular arrangements shown in the Figures should not be viewed as limiting. It should be understood that other embodiments may include more or less of each element shown in a given Figure. Further, some of the illustrated elements may be combined or omitted. Yet further, an illustrative embodiment may include elements that are not illustrated in the Figures.

A step or block that represents a processing of information can correspond to circuitry that can be configured to perform the specific logical functions of a herein-described method or technique. Alternatively or additionally, a step or block that represents a processing of information can correspond to a module, a segment, a physical computer (e.g., a field programmable gate array (FPGA) or application-specific integrated circuit (ASIC)), or a portion of program code (including related data). The program code can include one or more instructions executable by a processor for implementing specific logical functions or actions in the method or technique. The program code and/or related data can be stored on any type of computer readable medium such as a storage device including a disk, hard drive, or other storage medium.

The computer readable medium can also include non-transitory computer readable media such as computer-readable media that store data for short periods of time like register memory, processor cache, and random access memory (RAM). The computer readable media can also include non-transitory computer readable media that store program code and/or data for longer periods of time. Thus, the computer readable media may include secondary or persistent long term storage, like read only memory (ROM), optical or magnetic disks, compact-disc read only memory (CD-ROM), for example. The computer readable media can also be any other volatile or non-volatile storage systems. A computer readable medium can be considered a computer readable storage medium, for example, or a tangible storage device.

While various examples and embodiments have been disclosed, other examples and embodiments will be apparent to those skilled in the art. The various disclosed examples and embodiments are for purposes of illustration and are not intended to be limiting, with the true scope being indicated by the following claims.

What is claimed is:

1. A method comprising:
depositing a photoresist material on a substrate;
overlaying a first mask on the photoresist material, wherein the first mask defines a first feature;
causing a light source to illuminate the photoresist material through the first mask during a first exposure, wherein the light source is positioned at a first angle, wherein the first angle comprises a non-normal angle with respect to a plane parallel to the substrate;
developing the photoresist material so as to provide an optical element including retaining an elongate portion of the photoresist material on the substrate, wherein a first end of the elongate portion comprises an angled portion, and wherein the angled portion is sloped at an angle with respect to a long axis of the elongate portion;
overlaying a second mask on the developed photoresist material, wherein the second mask defines a second feature corresponding to the angled portion; and
depositing a reflective material through the second mask onto the angled portion,
wherein the optical element includes a first light guide portion and a second light guide portion, a first end facet and a second end facet, wherein light coupled via the first end facet into the first light guide portion as coupled emission light is outcoupled to an environment via the second end facet and after reflection or redirection is coupled via the second end facet as coupled received light, guided within the second light guide portion toward the angled portion, and reflected by the angled portion as reflected light in an out-of-plane direction with respect to a respective light propagation direction or vector of the coupled emission light and/or the coupled received light.

2. The method of claim 1, wherein the light source is optically coupled to a collimating lens.

3. The method of claim 1, further comprising:
immersing the substrate and the photoresist material in a bath, wherein the bath comprises a liquid, wherein causing the light source to illuminate the photoresist material comprises causing the light source to illuminate the photoresist material through at least a portion of the liquid.

4. The method of claim 1, further comprising:
causing the light source to illuminate the photoresist material through the first mask during a second exposure, wherein the second exposure comprises the light source being positioned at a second angle with respect to the plane parallel to the substrate.

5. The method of claim 1, further comprising:
while causing the light source to illuminate the photoresist material through the first mask, adjusting a position of the substrate with respect to the light source.

6. The method of claim 1, further comprising:
while causing the light source to illuminate the photoresist material through the first mask, adjusting a position of the light source with respect to the substrate.

7. The method of claim 1, wherein the elongate portion comprises a light guide manifold, wherein the method further comprise:
coupling an aperture plate to the light guide manifold, wherein the aperture plate comprises at least one aperture, wherein the at least one aperture is optically coupled to the light guide manifold, and optionally wherein the aperture plate is coupled to a distal end of the light guide manifold, wherein the method further comprises:
coupling a light-emitter device to a proximal end of the light guide manifold.

8. A method comprising:
depositing a photoresist material on a substrate;
overlaying a first mask on the photoresist material, wherein the first mask defines a first feature;
overlaying a second mask on the first mask, wherein the second mask defines a second feature;
causing a light source to illuminate the photoresist material through the first mask and the second mask, wherein the light source is positioned at a first angle, wherein the first angle comprises a non-normal angle with respect to a plane parallel to the substrate;
removing the second mask;
overlaying a third mask on the first mask, wherein the third mask defines a third feature;
causing the light source to illuminate the photoresist material through the third mask and the first mask during an initial exposure;
developing the photoresist material so as to provide an optical element including retaining an elongate portion of the photoresist material on the substrate, wherein a first end of the elongate portion comprises an angled portion, and wherein the angled portion is sloped at an angle with respect to a long axis of the elongate portion;
overlaying a fourth mask on the developed photoresist material, wherein the fourth mask defines a fourth feature to correspond to the angled portion; and
depositing a reflective material through the fourth mask onto the angled portion,
wherein the optical element includes a first light guide portion and a second light guide portion, a first end facet and a second end facet, wherein light coupled via the first end facet into the first light guide portion as coupled emission light is outcoupled to an environment via the second end facet and after reflection or redirection is coupled via the second end facet as coupled received light, guided within the second light guide portion toward the angled portion, and reflected by the angled portion as reflected light in an out-of-plane direction with respect to a respective light propagation direction or vector of the coupled emission light and/or the coupled received light.

9. The method of claim 8, further comprising:

causing the light source to illuminate the photoresist material through the third mask and the first mask, wherein the light source is positioned at a second angle with respect to the plane parallel to the substrate during a subsequent exposure.

10. The method of claim 8, further comprising:

while causing the light source to illuminate the photoresist material through the first mask and the second mask, adjusting a position of the substrate with respect to the light source.

11. The method of claim 8, further comprising:

while causing the light source to illuminate the photoresist material through the third mask and the first mask, adjusting a position of the substrate with respect to the light source.

12. The method of claim 8, further comprising:

while causing the light source to illuminate the photoresist material through the first mask and the second mask, adjusting a position of the light source with respect to the substrate, or while causing the light source to illuminate the photoresist material through the third mask and the first mask, adjusting a position of the light source with respect to the substrate.

13. The method of claim 8, wherein depositing the photoresist material on the substrate comprises depositing a negative SU-8 resist on the substrate.

14. The method of claim 8, wherein the reflective material comprises a metal that is optically-reflective in a near-infrared wavelength range.

15. The method of claim 8, wherein the elongate portion comprises a light guide manifold, wherein the method further comprises:

coupling an aperture plate to the light guide manifold, wherein the aperture plate comprises at least one aperture, wherein the at least one aperture is optically coupled to the light guide manifold, and optionally wherein the aperture plate is coupled to a distal end of the light guide manifold, wherein the method further comprises:

coupling a light-emitter device to a proximal end of the light guide manifold.

16. A method comprising:

depositing a photoresist material on a substrate;

overlaying a first mask on the photoresist material, wherein the first mask defines a first feature;

causing a light source to illuminate the photoresist material through the first mask during a first exposure, wherein the light source is positioned at a first angle, wherein the first angle comprises a non-normal angle with respect to a plane parallel to the substrate;

causing the light source to illuminate the photoresist material through the first mask during a second exposure, wherein the light source is positioned at a second angle, wherein the second angle comprises a substantially normal angle with respect to the plane parallel to the substrate;

developing the photoresist material so as to retain an elongate portion of the photoresist material on the substrate, wherein a first end of the elongate portion comprises an angled portion, wherein the angled portion is sloped at an angle with respect to a long axis of the elongate portion, and wherein a second end of the elongate portion that is opposite to the first end comprises an endface that is substantially normal to the long axis of the elongate portion;

overlaying a second mask on the developed photoresist material, wherein the second mask defines a second feature corresponding to the angled portion; and depositing a reflective material through the second mask onto the angled portion.

17. The method of claim 16, wherein the light source is optically coupled to a collimating lens.

18. The method of claim 16, further comprising:

immersing the substrate and the photoresist material in a bath, wherein the bath comprises a liquid, wherein causing the light source to illuminate the photoresist material comprises causing the light source to illuminate the photoresist material through at least a portion of the liquid.

19. The method of claim 16, further comprising:

while causing the light source to illuminate the photoresist material through the first mask, adjusting a position of the substrate with respect to the light source.

20. The method of claim 16, further comprising:

while causing the light source to illuminate the photoresist material through the first mask, adjusting a position of the light source with respect to the substrate.

* * * * *